(12) United States Patent
Baur et al.

(10) Patent No.: US 9,123,528 B2
(45) Date of Patent: Sep. 1, 2015

(54) COMPOSITE SUBSTRATE, SEMICONDUCTOR CHIP HAVING A COMPOSITE SUBSTRATE AND METHOD FOR PRODUCING COMPOSITE SUBSTRATES AND SEMICONDUCTOR CHIPS

(75) Inventors: Johannes Baur, Regensburg (DE); Berthold Hahn, Hemau (DE); Karl Engl, Pentling (DE); Volker Haerle, Laaber (DE); Ann-Kathrin Haerle, legal representative, Deuerling (DE); Jakob Johannes Haerle, legal representative, Deuerling (DE); Johanna Magdalena Haerle, legal representative, Deuerling (DE); Joachim Hertkorn, Alteglofsheim (DE); Tetsuya Taki, Yokohama (JP)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 7 days.

(21) Appl. No.: 13/883,730

(22) PCT Filed: Dec. 16, 2011

(86) PCT No.: PCT/EP2011/073134
§ 371 (c)(1),
(2), (4) Date: Aug. 2, 2013

(87) PCT Pub. No.: WO2012/089540
PCT Pub. Date: Jul. 5, 2012

(65) Prior Publication Data
US 2014/0203413 A1    Jul. 24, 2014

(30) Foreign Application Priority Data

Dec. 28, 2010   (DE) .......................... 10 2010 056 447
Feb. 24, 2011   (DE) .......................... 10 2011 012 298

(51) Int. Cl.
    H01L 29/02      (2006.01)
    H01L 21/78      (2006.01)
    (Continued)

(52) U.S. Cl.
    CPC .......... *H01L 29/02* (2013.01); *H01L 21/02612* (2013.01); *H01L 21/78* (2013.01); *H01L 33/0079* (2013.01); *H01L 33/08* (2013.01);
    (Continued)

(58) Field of Classification Search
    CPC ........................... H01L 33/50; H01L 33/0079
    See application file for complete search history.

(56) References Cited

U.S. PATENT DOCUMENTS 6,222,974 B1 * 4/2001 Nagata .......................... 385/129
6,395,564 B1 * 5/2002 Huang .............................. 438/7
(Continued)

FOREIGN PATENT DOCUMENTS

CN   101176212 A   5/2008
CN   102428583 A   4/2012
(Continued)

*Primary Examiner* — Michael Lebentritt
*Assistant Examiner* — Jordan Klein
(74) *Attorney, Agent, or Firm* — Slater & Matsil, L.L.P.

(57) ABSTRACT

A composite substrate has a carrier and a utility layer. The utility layer is attached to the carrier by means of a dielectric bonding layer and the carrier contains a radiation conversion material. Other embodiments relate to a semiconductor chip having such a composite substrate, a method for producing a composite substrate and a method for producing a semiconductor chip with a composite substrate.

14 Claims, 5 Drawing Sheets

(51) Int. Cl.
*H01L 21/02* (2006.01)
*H01L 33/00* (2010.01)
*H01L 33/08* (2010.01)

(52) U.S. Cl.
CPC ............... *H01L 2224/32225* (2013.01); *H01L 2224/48091* (2013.01); *H01L 2224/48227* (2013.01); *H01L 2224/49107* (2013.01); *H01L 2224/73265* (2013.01)

(56) References Cited

U.S. PATENT DOCUMENTS

| | | | | |
|---|---|---|---|---|
| 7,514,721 | B2 * | 4/2009 | Krames et al. | 257/98 |
| 7,956,368 | B2 | 6/2011 | Nagai et al. | |
| 8,278,674 | B2 * | 10/2012 | Krames et al. | 257/98 |
| 8,445,929 | B2 * | 5/2013 | Krames et al. | 257/98 |
| 8,476,643 | B2 | 7/2013 | Hahn et al. | |
| 8,723,199 | B2 | 5/2014 | Eberhard et al. | |
| 2003/0020397 | A1 * | 1/2003 | Beatty | 313/503 |
| 2003/0089918 | A1 * | 5/2003 | Hiller et al. | 257/98 |
| 2004/0033638 | A1 * | 2/2004 | Bader et al. | 438/46 |
| 2004/0056254 | A1 * | 3/2004 | Bader et al. | 257/79 |
| 2005/0023550 | A1 * | 2/2005 | Eliashevich et al. | 257/99 |
| 2005/0026394 | A1 * | 2/2005 | Letertre et al. | 438/459 |
| 2006/0202105 | A1 * | 9/2006 | Krames et al. | 250/208.1 |
| 2007/0126017 | A1 | 6/2007 | Krames et al. | |
| 2008/0173863 | A1 * | 7/2008 | Hahn et al. | 257/13 |
| 2008/0277674 | A1 | 11/2008 | Nagai et al. | |
| 2009/0184624 | A1 * | 7/2009 | Schmidt et al. | 313/498 |
| 2010/0047939 | A1 * | 2/2010 | Kamei | 438/27 |
| 2011/0121332 | A1 * | 5/2011 | Dupont et al. | 257/98 |
| 2011/0156056 | A1 | 6/2011 | Krames et al. | |
| 2011/0272720 | A1 * | 11/2011 | Gardner et al. | 257/98 |
| 2012/0025252 | A1 * | 2/2012 | Ichizono et al. | 257/98 |
| 2012/0069546 | A1 | 3/2012 | Bechtel et al. | |

FOREIGN PATENT DOCUMENTS

| | | |
|---|---|---|
| DE | 10 2005 040 558 A1 | 3/2007 |
| DE | 102007002416 A1 | 10/2007 |
| DE | 10 2007 052 181 A1 | 4/2009 |
| DE | 10 2009 042 324 A1 | 4/2010 |
| DE | 10 2009 019 161 A1 | 11/2010 |
| DE | 10 2009 027 977 A1 | 1/2011 |
| EP | 1 811 580 A1 | 7/2007 |
| EP | 1 437 776 B1 | 9/2011 |
| JP | 2006352085 A | 12/2006 |
| JP | 2007511065 A | 4/2007 |
| JP | 2007150331 A | 6/2007 |
| JP | 2007288195 A | 11/2007 |
| JP | 2010186873 A | 8/2010 |
| WO | 2005043631 A2 | 5/2005 |
| WO | 2009083001 A2 | 7/2009 |
| WO | WO 2010/045915 A1 | 4/2010 |
| WO | WO 2010/134011 A1 | 11/2010 |
| WO | 2012059844 A1 | 5/2012 |

* cited by examiner

COMPOSITE SUBSTRATE, SEMICONDUCTOR CHIP HAVING A COMPOSITE SUBSTRATE AND METHOD FOR PRODUCING COMPOSITE SUBSTRATES AND SEMICONDUCTOR CHIPS

This patent application is a national phase filing under section 371 of PCT/EP2011/073134, filed Dec. 16, 2011, which claims the priority of German patent application 10 2010 056 447.8, filed Dec. 28, 2010, and German patent application 10 2011 012 298.2, filed Feb. 24, 2011, each of which is incorporated herein by reference in its entirety.

TECHNICAL FIELD

The present application relates to a composite substrate, a semiconductor chip having a composite substrate and a method for producing composite substrates and semiconductor chips.

BACKGROUND

White light sources based on optoelectronic semiconductor chips typically comprise a semiconductor chip intended for generating radiation and a radiation conversion material, which is intended for partially converting radiation generated in the semiconductor chip, such that overall radiation is emitted which appears white to the human eye.

This radiation conversion material is often embedded in a semiconductor chip enclosure.

The comparatively low refractive index of the material used for potting purposes makes it difficult to couple the radiation conversion material to the semiconductor chip efficiently.

SUMMARY OF THE INVENTION

In one aspect, the invention provides an efficient and technically simple way of converting radiation. Further embodiments provide a production method with which radiation conversion can be achieved efficiently and inexpensively for white light sources on the basis of optoelectronic semiconductor chips.

According to one embodiment, a composite substrate comprises a carrier and a utility layer, the utility layer being attached to the carrier by means of a dielectric bonding layer. The carrier contains a radiation conversion material.

Such a composite substrate is particularly suitable for use as an epitaxy substrate, in particular for the production of optoelectronic semiconductor chips. A surface of the utility layer remote from the carrier is preferably provided as a deposition surface.

The carrier is preferably so thick that it is self-supporting and furthermore preferably mechanically stabilizes the material to be deposited on the carrier, in particular even at temperatures of for example 700° C. to 1100° C. used for epitaxy methods.

The proportion of radiation of a first wavelength range irradiated into the carrier which is converted into radiation of a second wavelength range different from the first wavelength range may be adjusted in particular by means of excitation efficiency, carrier thickness and/or radiation conversion material concentration.

In a preferred configuration, the carrier contains a ceramic and/or a glass.

A carrier containing a ceramic is preferably formed for the most part by the radiation conversion material. For the most part means here that the carrier contains a proportion by volume of radiation conversion material of at least 50%. The carrier preferably contains a proportion by volume of the radiation conversion material of at least 75%, particularly preferably a proportion by volume of at least 90%. To increase the thickness of the carrier while maintaining the same rate of conversion, the radiation conversion material may however also constitute a smaller proportion by volume in the carrier.

The ceramic is preferably formed of particles which are bonded together and/or with further particles to form the ceramic.

A suitable radiation conversion material is in particular material which can be bonded by sintering to form a ceramic. Use may be made, for example, of a garnet, in particular a rare earth metal-activated garnet, for instance $Y_3(Al, Ga)_5O_{12}$, for example, activated with Ce.

In the case of a glass-containing carrier, the glass preferably takes the form of a matrix material, in which the radiation conversion material is embedded.

The utility layer is conveniently thinner than the carrier. The thinner is the utility layer, the more cheaply can the composite substrate be produced. The utility layer preferably has a thickness of at most 1 μm, preferably a thickness of between 10 nm and 500 nm inclusive, particularly preferably between 10 nm and 200 nm inclusive.

In a preferred configuration, the utility layer contains a material which is suitable for the deposition of nitride compound semiconductor material.

"Based on nitride compound semiconductors" means in the present context that the active epitaxial layer sequence or at least one layer thereof comprises a III/V nitride compound semiconductor material, preferably $Al_nGa_mIn_{1-n-m}N$, wherein $0 \leq n \leq 1$, $0 \leq m \leq 1$ and $n+m \leq 1$.

This material need not necessarily exhibit a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

The utility layer is preferably based on a nitride compound semiconductor material. Such a utility layer is particularly suitable for the deposition of high-quality nitride compound semiconductor material.

In a preferred configuration, solely the dielectric bonding layer is arranged between the utility layer and the carrier. In other words, the radiation conversion material is only spaced from the utility layer by the dielectric bonding layer.

In a further preferred configuration, the dielectric bonding layer contains an oxide, for example, silicon oxide, a nitride, for example, silicon nitride, or an oxynitride, for example, silicon oxynitride. During production, such a bonding layer is distinguished by a particularly simple and stable bond between the utility layer and the carrier. In the case of an oxynitride, the refractive index is adjustable by way of the material composition.

In a preferred configuration, a refractive index of the dielectric bonding layer reduces from the utility layer towards the carrier. The reduction may proceed continuously or in stages. Variation of the material of the dielectric bonding layer is particularly convenient when the material of higher refractive index used for the dielectric bonding layer exhibits a higher absorption coefficient than the material of lower refractive index.

In a preferred configuration, the bonding layer adjoins a patterned boundary surface on at least one side. In particular, a surface of the carrier facing the utility layer and/or a surface of the utility layer facing the carrier may exhibit patterning. Patterning may be irregular, for example, in the form of roughening, or regular, for instance, in the form of a periodically repeating pattern.

Furthermore, the patterning may form an optical element.

The above-described composite substrate is particularly suitable for the production of an optoelectronic semiconductor chip, in particular of a luminescent diode chip, for instance, an LED. In a preferred configuration, a semiconductor body, which comprises a semiconductor layer sequence with an active region intended for generating radiation, is arranged on the utility layer, the radiation of a first wavelength range generated in the active region during operation being converted at least in part by means of the radiation conversion material into a second wavelength range different from the first wavelength range.

In the case of such a semiconductor chip, the composite substrate may thus serve during production as an epitaxy substrate, and fulfill the function of a radiation conversion element integrated into the semiconductor chip when said semiconductor chip is in operation. In other words, during production the semiconductor chips comprise the radiation conversion material even before singulation thereof from a semiconductor chip assembly.

It is thus possible to dispense with additional radiation conversion material applied subsequently to the semiconductor chip or introduced into a semiconductor chip potting material.

Furthermore, the semiconductor chip is distinguished by particularly good optical coupling of the radiation conversion material to the active region, since all that is arranged between the radiation conversion material and the semiconductor material of the semiconductor chip is the dielectric bonding layer of the composite substrate. The carrier may furthermore mechanically stabilize the semiconductor body, such that the semiconductor chip is distinguished overall by high mechanical stability. In addition, the semiconductor chip is distinguished by good heat dissipating properties due to the comparatively high thermal conductivity of the carrier and/or the dielectric bonding layer. The thickness of the carrier preferably amounts, in the finished semiconductor chip, to between 10 µm and 200 µm inclusive, particularly preferably between 20 µm and 100 µm inclusive, for example, 50 µm.

In a variant configuration, the carrier comprises a minor layer on the side remote from the semiconductor body. Such a semiconductor chip is preferably intended for mounting on the minor layer side. Radiation emitted by the active region towards the carrier may be reflected at the minor layer and exit in particular at a semiconductor chip radiation exit face remote from the minor layer after at least one further passage through the carrier.

In an alternative configuration, a major face of the carrier remote from the semiconductor layer sequence forms a radiation exit face. Such a semiconductor chip is particularly suitable for mounting in flip-chip geometry.

In a method for producing a composite substrate with a carrier and a utility layer, according to one embodiment a carrier is provided which contains a radiation conversion material. The utility layer is attached to the carrier by means of a dielectric bonding layer.

The utility layer is preferably attached by direct bonding. In contrast with adhesive bonding using a glue layer, no adhesion layer is needed for attachment. Bonding may, for example, be achieved directly by input of heat and exertion of pressure.

In a preferred configuration, the utility layer is provided on an auxiliary carrier. After attachment to the carrier, the utility layer is detached from the other, auxiliary carrier. The auxiliary carrier serves for preferably epitaxial deposition of the material for the utility layer. After detachment of the auxiliary carrier, the latter may be reused for further production steps.

In a preferred configuration, separation nuclei are formed, along which the utility layer is detached after attachment to the carrier. This may be achieved, for example, by ion implantation, wherein the position of the separation nuclei and thus the thickness of the utility layer after detachment may be adjusted via the energy of the introduced ions.

Detachment preferably proceeds through heating of the assembly consisting of carrier and auxiliary carrier.

In a method for producing a plurality of semiconductor chips, a composite substrate is provided according to one embodiment. A semiconductor layer sequence with an active region provided for generating radiation is deposited on the composite substrate, preferably epitaxially, for instance, using MBE or MOCVD.

The composite substrate with the semiconductor layer sequence is singulated into a plurality of semiconductor chips. Singulation may proceed, for example, by means of coherent radiation, mechanically or chemically.

During production, the composite substrate mechanically stabilizes the semiconductor layer sequence. In the finished semiconductor chip, the composite substrate may remain completely or at least in part in the component and fulfill the function of a radiation conversion element.

In a preferred configuration, the thickness of the carrier is reduced after deposition of the semiconductor layer sequence. For mechanical stabilization during epitaxial deposition of the semiconductor layer sequence, the carrier may thus exhibit a greater thickness than in the finished semiconductor chip. Thinning may proceed before or after singulation of the composite substrate.

The semiconductor chip is preferably electrically contacted even during thickness reduction, such that by said thickness reduction, the color locus of the radiation emitted by the semiconductor chip may be adjusted, in particular individually and separately for each semiconductor chip.

The methods described for producing a composite substrate or a plurality of semiconductor chips are particularly suitable for producing a composite substrate described further above or a semiconductor chip. Features described in connection with the composite substrate or the semiconductor chip may therefore also be referred to for the production methods or vice versa.

BRIEF DESCRIPTION OF THE DRAWINGS

Further features, configurations and convenient aspects are revealed by the following description of the exemplary embodiments in conjunction with the figures, in which.

Figure 1A:
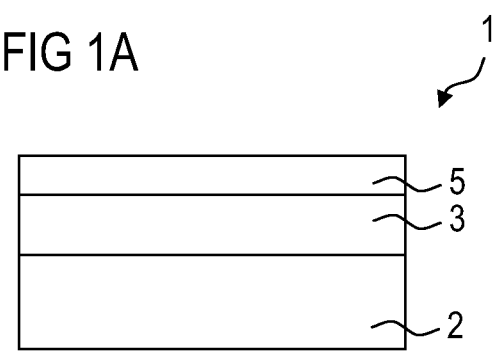
FIGS. 1A and 1B respectively show first and second exemplary embodiments of a composite substrate, in schematic sectional view.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

A first exemplary embodiment of a composite substrate is illustrated schematically in sectional view in FIG. 1A. The composite substrate 1 comprises a carrier 2 and a utility layer 5. Between the carrier and the utility layer a dielectric bonding layer 3 is arranged. A surface of the utility layer remote from the carrier 2 takes the form of a deposition surface for epitaxial deposition.

The carrier 2 comprises a radiation conversion material, for example a luminescent or phosphorescent material. The carrier may take the form of a ceramic, the radiation conversion material, in the form of luminescent material particles, being joined together into a ceramic, for example, by sintering, to produce the carrier. To produce the ceramic, further particles and/or additives may be admixed, in addition to the radiation conversion material. The additives may exit completely from the carrier during production or remain at least in part in the carrier.

A ceramic-based carrier is preferably formed for the most part by the radiation conversion material. The carrier preferably contains a proportion by volume of the radiation conversion material of at least 75%, particularly preferably of at least 90%.

A ceramic having a radiation conversion material and a method for producing such a ceramic is described in International Patent Publication No. WO 2010/045915, the disclosure content of which is hereby included explicitly by reference in this respect in the present application.

A suitable radiation conversion material is in particular a garnet, for example, $Y_3(Al, Ga)_5O_{12}$, doped with rare earth metals, for example, Ce.

Alternatively or in addition, the carrier may contain at least one of the following materials: rare earth metal-activated alkaline earth metal sulfides, rare earth metal-activated thiogallates, rare earth metal-activated aluminates, rare earth metal-activated orthosilicates, rare earth metal-activated chlorosilicates, rare earth metal-activated alkaline earth metal silicon nitrides, rare earth metal-activated oxynitrides and rare earth metal-activated aluminum oxynitrides, rare earth metal-activated silicon nitrides.

Alternatively or in addition, the carrier may comprise a matrix material, for example, a glass, in which the radiation conversion material is embedded. In this case, the radiation conversion material and the glass are conveniently adapted to one another in such a way that the radiation conversion material is not degraded or destroyed on introduction into the glass melt. The proportion by volume of the radiation conversion material amounts in this case preferably to between 5% and 30% inclusive.

The dielectric bonding layer 3 preferably contains an oxide, for example, silicon oxide, a nitride, for example, silicon nitride, or an oxynitride, for example, silicon oxynitride. In the case of silicon oxynitride, the refractive index can be adjusted by varying the nitrogen content between approximately 1.4 and 2.5, the refractive index being higher, the greater the nitrogen content.

The composition of the dielectric bonding layer 3 may vary in the perpendicular direction, i.e., in a direction extending perpendicular to a main plane of extension of the composite substrate 1. Preferably, the dielectric bonding layer 3 exhibits a higher refractive index on the side facing the utility layer 5 than on the side facing the carrier 2. The refractive index may reduce continuously or in steps towards the carrier.

For silicon oxynitride it is not only the refractive index, but also the absorption coefficient which increases as the nitrogen content increases. A dielectric bonding layer with a nitrogen content decreasing towards the carrier is therefore distinguished in comparison with a pure silicon oxide layer by better refractive index adaptation to semiconductor material and in comparison with a pure silicon nitride layer by lower absorption for the same thickness.

The utility layer 5 is preferably constructed such that it is suitable for the deposition of III-V compound semiconductor material. The utility layer 5 is preferably based on a nitride compound semiconductor material. In contrast thereto, the utility layer may however also contain another material, in particular, another semiconductor material such as, for example, silicon, silicon carbide, gallium phosphide or gallium arsenide or consist of such a material.

Figure 1B:
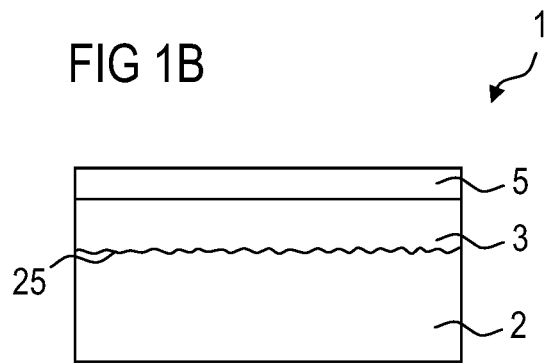

The second exemplary embodiment, illustrated in FIG. 1B, of a composite substrate corresponds substantially to the first exemplary embodiment described in connection with FIG. 1A.

In contrast thereto, the composite substrate 1 exhibits patterning 25, which is formed by way of example at a boundary surface between the carrier 2 and the dielectric bonding layer 3. Alternatively or in addition, a boundary surface between the utility layer and the dielectric bonding layer 3 may also be patterned.

The patterning 25 may, for example, be formed irregularly by means of roughening. Regular, in particular periodically repeating patterning may also be used. The patterning is provided in particular for the purpose of reducing waveguide effects of radiation irradiated into the composite substrate 1 and/or radiation converted by means of the radiation conversion material. Alternatively or in addition, the patterning 25 may fulfill the function of an optical element, for example, a lens or a diffraction grating. Furthermore, the patterning and/or the optical element may alternatively or in addition also be formed on the side of the carrier 2 remote from the utility layer 5.

FIGS. 2A to 2E show a first exemplary embodiment of production of a composite substrate by way of intermediate steps shown schematically in sectional view.

Figure 2A:
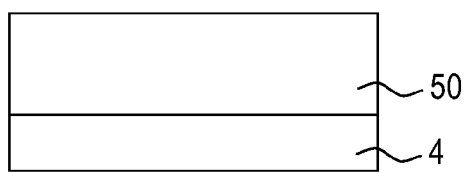
FIGS. 2A to 2E show an exemplary embodiment of a method for producing a composite substrate, by means of intermediate steps shown schematically in sectional view.

As shown in FIG. 2A, a semiconductor material 50 is provided on an auxiliary carrier 4. The auxiliary carrier 4 serves in particular in epitaxial deposition of the semiconductor material 50, for example, by means of MBE or MOCVD.

Figure 2B:
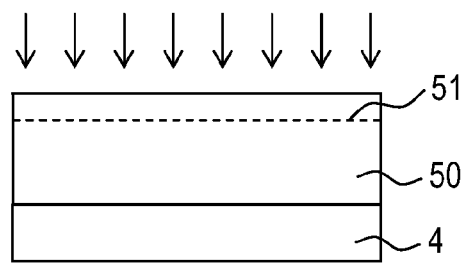
Figure 2C:
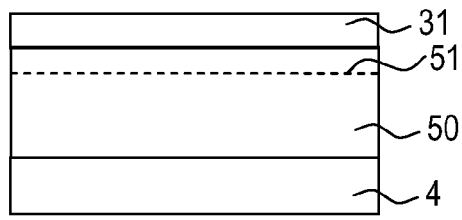
Figure 2D:
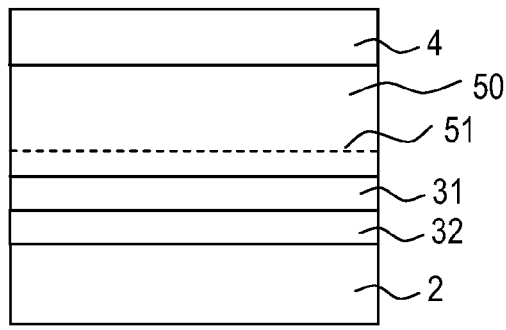

Separation nuclei 51 are formed in the semiconductor material 50 by implanting ions, for example, hydrogen ions (shown by arrows in FIG. 2B). The separation nuclei extend in a plane extending parallel to a surface of the semiconductor material 50 remote from the auxiliary carrier 4. The energy of the ions determines the penetration depth of the ions into the semiconductor material and thus the thickness of the semiconductor material subsequently to be transferred.

The thickness preferably amounts to at most 1 µm, preferably between 10 nm and 500 nm inclusive, particularly preferably between 10 nm and 200 nm inclusive.

A first dielectric sublayer 31 is deposited on the semiconductor material 50, said sublayer constituting part of the dielectric bonding layer 3 in the finished composite substrate.

The carrier 2 is coated with a second dielectric sublayer 32. As shown in step 2D, the carrier 2 and the auxiliary carrier 4 are positioned relative to one another in such a way that the first dielectric sublayer 31 and the second dielectric sublayer 32 adjoin one another directly. The dielectric sublayers 31, 32 are joined together by direct bonding, for example, by pressing together at a temperature of between 700° C. and 1200° C., and together form the dielectric bonding layer 3. An adhesion layer such as a glue layer or a solder layer is not required to produce the bond.

Figure 2E:
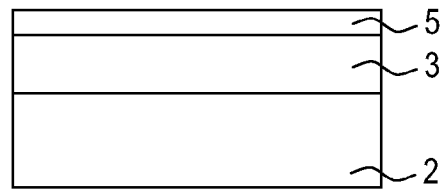

Once the directly bonded joint has been produced, the auxiliary carrier 4 is detached along the separation nuclei, with part of the semiconductor material 50. This is preferably thermally induced. The semiconductor material remaining on the carrier 2 forms the utility layer 5 of the composite substrate 1 (FIG. 2E). The auxiliary carrier can be reused after detachment to produce further composite substrates.

Unlike in the exemplary embodiment described, it is also feasible for the semiconductor material 50 for the utility layer 5 to stem directly from the auxiliary carrier 4. Epitaxial deposition on the auxiliary carrier is not necessary in this case.

Figure 3A:
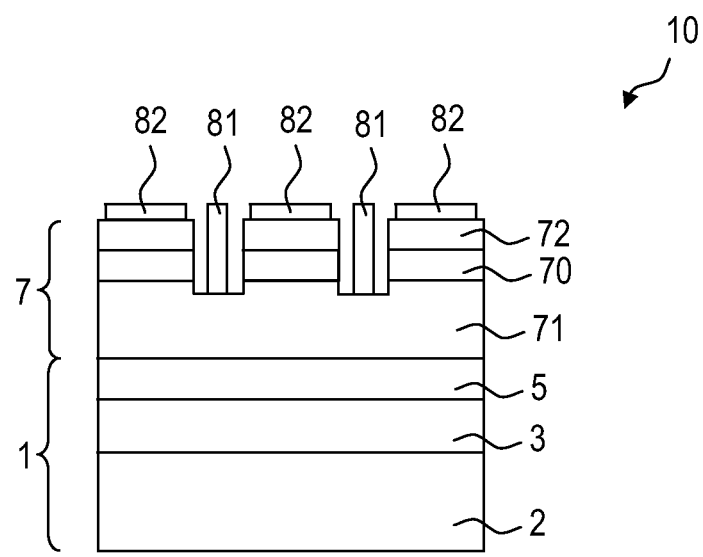
FIGS. 3A and 3B show an exemplary embodiment of a semiconductor chip with a composite substrate (FIG. 3A) and a component with such a semiconductor chip (FIG. 3B)

A first exemplary embodiment of a semiconductor chip is shown in schematic sectional view in FIG. 3A. By way of example, the semiconductor chip 10 comprises a composite substrate 1 constructed as described in relation to FIG. 1A.

A semiconductor body 7 with a semiconductor layer sequence 700 is arranged on the composite substrate 1. The semiconductor layer sequence, which forms the semiconductor body, comprises an active region 70, which is arranged between a first semiconductor layer 71 and a second semiconductor layer 72. The first semiconductor layer 71 and the second semiconductor layer 72 conveniently differ from one another with regard to their conduction type. For example, the first semiconductor layer 71 may be n-conductive and the second semiconductor layer 72 p-conductive or vice versa.

The first semiconductor layer 71 and the second semiconductor layer 72 are each connected electrically conductively to a first contact 81 and a second contact 82 respectively. The contacts 81, 82 are intended for external electrical contacting of the semiconductor chip 10. When the semiconductor chip 10 is in operation, charge carriers can be injected from different sides via the contacts into the active region 70 and there recombine, with emission of radiation of a first wavelength range.

The radiation of the first wavelength range is converted in the composite substrate 1, in particular in the carrier 2, partially into radiation of a second wavelength range different from the first wavelength range.

For example, the active region 70 may be intended for generating radiation in the blue spectral range and the radiation conversion material in the carrier 2 may be intended for converting radiation into radiation in the yellow spectral range, such that mixed light which appears white to the human eye emerges from the semiconductor chip 10. Radiation thus proceeds in the semiconductor chip itself. In contrast to a component in which radiation conversion material is embedded in an enclosure or in which a radiation conversion element is attached to the semiconductor chip by means of an adhesion layer, the radiation does not pass through any material with a comparatively low refractive index, such as, for example, silicone, prior to radiation conversion. Because the refractive index of the dielectric bonding layer 3 is high compared with silicone, said bonding layer separating the radiation conversion material of the carrier 2 from the semiconductor material of the semiconductor chip 10, the radiation conversion material is coupled optically particularly efficiently to the semiconductor material. Furthermore, thermal resistance is reduced by the dielectric bonding layer compared with a semiconductor chip to which a conversion element is attached using an adhesion layer. The heat conduction of a 250 nm thick dielectric bonding layer 3 of silicon oxide is, for example, approximately ten times that of a 1 µm thick silicone layer.

Figure 3B:
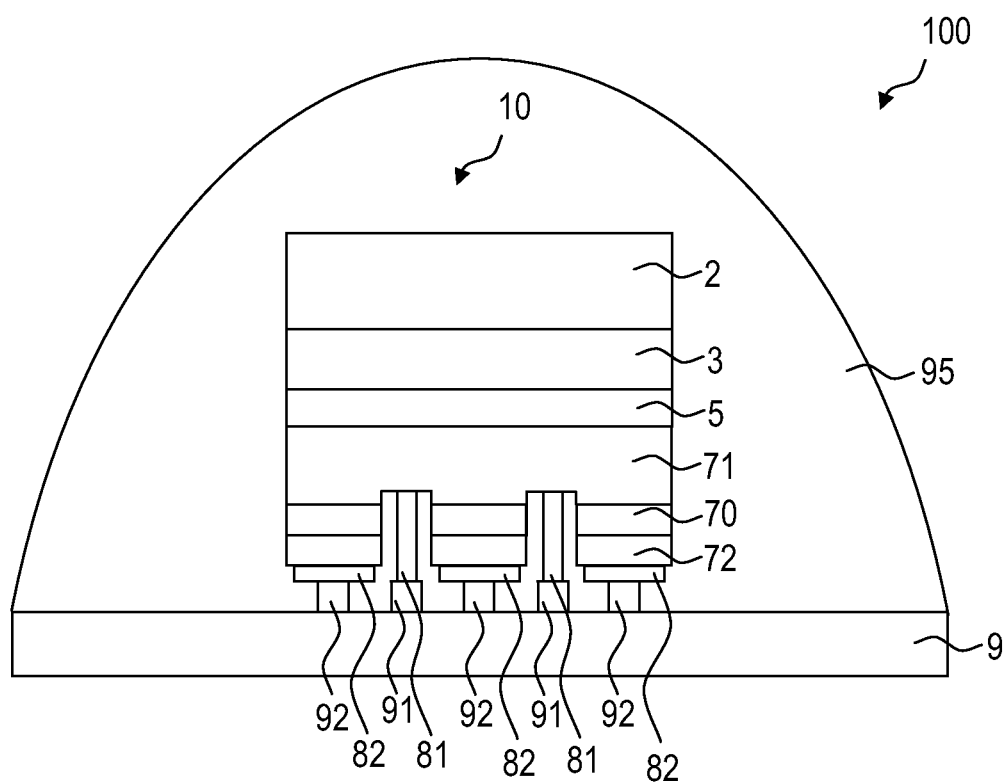

One exemplary embodiment of a radiation-emitting component 100 with such a semiconductor chip is illustrated schematically and in sectional view in FIG. 3B. The semiconductor chip 10 is attached to a connection carrier 9. The first contact 81 and the second contact 82 are each connected electrically conductively with the connection carrier by a first land 91 and a second land 92 respectively.

The connection carrier 9 may for example be a circuit board, in particular a printed circuit board (PCB), an intermediate carrier (sub-mount), for example, a ceramic carrier, or a housing body in particular for a surface-mountable component. In particular, the first land 91 and the second land 92 may be formed by a lead frame.

The semiconductor chip 10 is embedded in an encapsulation 95. The encapsulation is conveniently transparent or at least translucent to the radiation emitted by the semiconductor chip 10. In particular, the encapsulation may be free of radiation conversion material, since this is already contained in the carrier 2 of the composite substrate 1. A silicone, an epoxide or a hybrid material with a silicone and an epoxide is particularly suitable for the encapsulation.

Alternatively, a further radiation conversion material and/or diffuser material may be contained in the encapsulation, in addition to the radiation conversion material in the carrier 2. The further radiation conversion material may in particular be provided to adjust the color locus of the radiation emitted by the radiation-emitting component 100.

The semiconductor chip 10 is arranged in flip-chip geometry on the connection carrier 9, i.e., the composite substrate 1 is arranged on the side of the semiconductor layer sequence 7 remote from the connection carrier 9. When the semiconductor chip is in operation, the carrier 2 thus forms on the top, i.e., remote from the connection carrier, a radiation exit face of the semiconductor chip 10.

In contrast with a thin-film semiconductor chip, in which the growth substrate is removed, the composite substrate remains completely or at least in part in the semiconductor chip. The carrier 2 may thus mechanically stabilize the semiconductor body 7, so reducing the risk of breakage.

The thickness of the carrier 2 preferably amounts to between 10 µm and 200 µm inclusive, particularly preferably between 20 µm and 100 µm inclusive, for example, 50 µm. During epitaxial deposition of the semiconductor layer sequence, the carrier may also exhibit a greater thickness. This makes it possible to reduce the risk of warping of the carrier at the comparatively high temperatures used in epitaxial deposition. The thickness of a thick carrier is reduced to the stated thickness after deposition. By way of the thickness it is possible to adjust the color locus of the radiation emitted by the finished semiconductor chip.

On production of the component 100, the semiconductor chip 10 may be electrically contacted to determine the color locus of the emitted radiation prior to formation of the encapsulation. To adapt the color locus, in particular to reduce the proportion of the radiation converted in the carrier 2, the thickness of the carrier may be reduced, for example, mechanically, for instance using grinding, lapping or polishing, or chemically, for instance, wet chemically or dry chemically or by means of material abrasion by coherent radiation, for instance, laser radiation. It is thus possible individually to adjust the color locus of the radiation emitted by the semiconductor chip, in particular even separately for each individual semiconductor chip. If necessary, the semiconductor chip may also be provided with a coating to adjust the color locus, which coating may likewise contain radiation conversion material.

The second exemplary embodiment, illustrated in FIG. 4A, of a semiconductor chip 10 corresponds substantially to the first exemplary embodiment described in connection with FIG. 3A. In contrast thereto, on the side of the composite substrate 1 remote from the semiconductor body 7 a mirror layer 96 is formed, which is intended to reflect the radiation generated in the active region 70. The preferably metallic minor layer 96 conveniently exhibits high reflectivity for the radiation generated in the active region 70 and/or the radiation converted in the carrier 2 by means of the radiation conversion material. In the visible spectral range, aluminum or silver are suitable examples.

Furthermore, unlike in the first exemplary embodiment, a radiation-transmissive contact layer 821 is formed on the second semiconductor layer 72, via which contact layer the charge carriers injected into the second contact 82 may be impressed uniformly and over a large area into the second semiconductor layer 72.

The radiation-transmissive contact layer 821 preferably contains a transparent conductive oxide (TCO), for example, indium-tin oxide (ITO) or zinc oxide (ZnO). Alternatively or in addition, the radiation-transmissive contact layer may comprise a metal layer, which is so thin that it transmits radiation generated in the semiconductor chip.

Figure 4A:
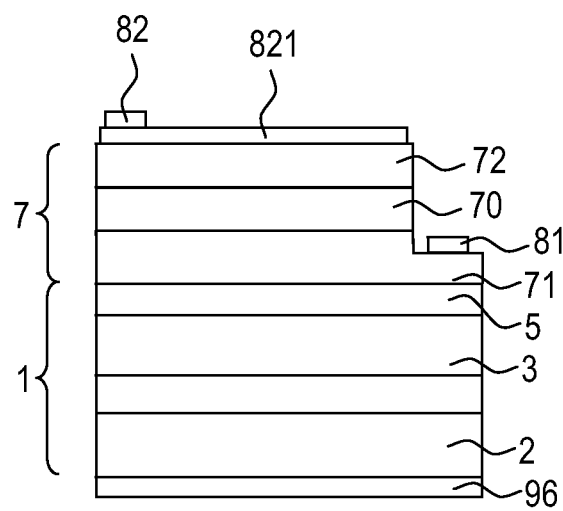
FIGS. 4A and 4B show a second exemplary embodiment of a semiconductor chip with a composite substrate (FIG. 4A) and a component with such a semiconductor chip (FIG. 4B), in each case in schematic sectional view.
Figure 4B:
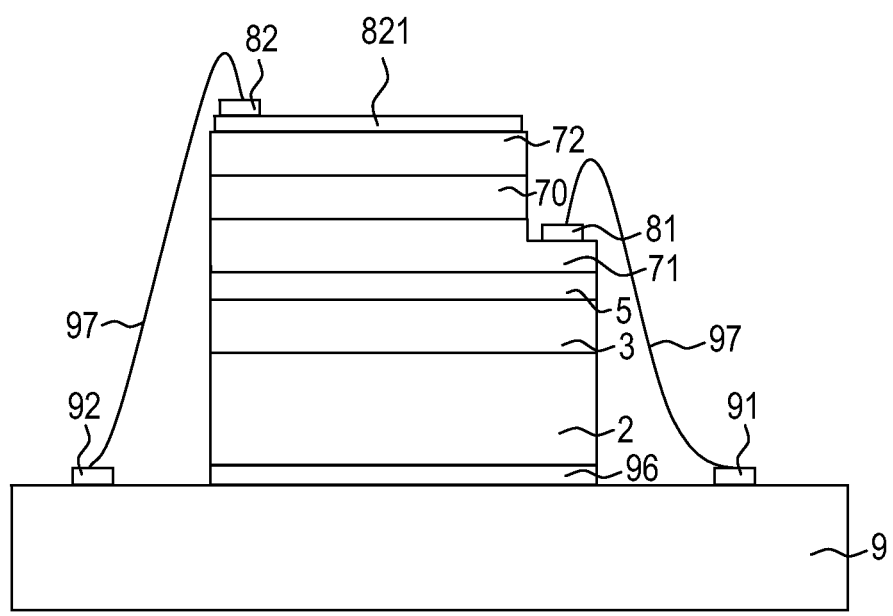

As shown in FIG. 4B, such a semiconductor chip is suitable, in particular, for mounting in which the minor layer 96 faces the connection carrier 9.

The contacts 81, 82 may be connected electrically conductively to the lands 91, 92 by way of connecting leads 97, for example, via wire bond connections.

Figure 5A:
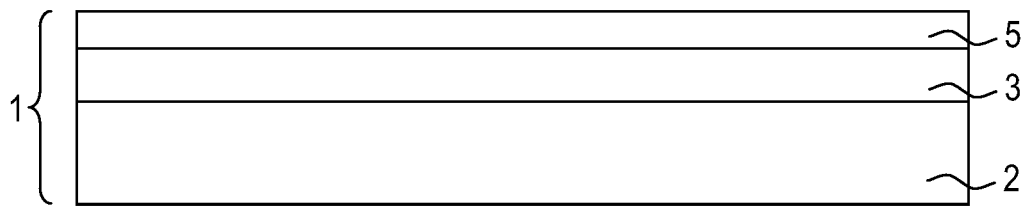
FIGS. 5A to 5C show an exemplary embodiment of a method for producing a plurality of semiconductor chips, by means of intermediate steps shown schematically in sectional view.
Figure 5B:
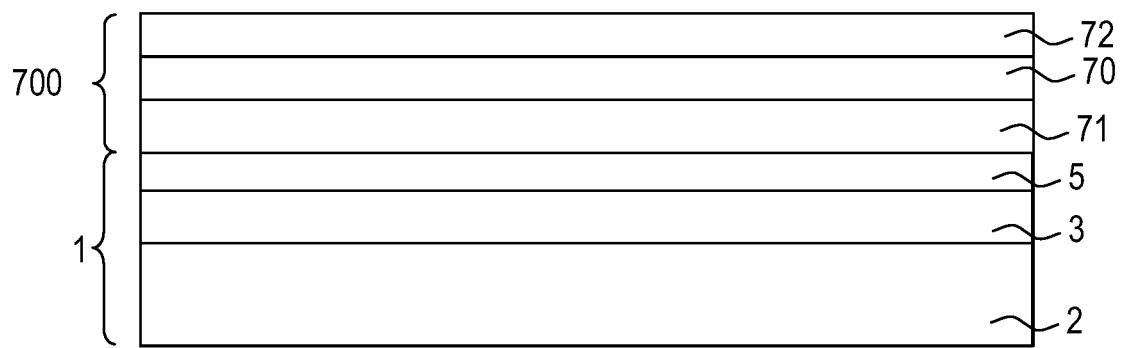
Figure 5C:
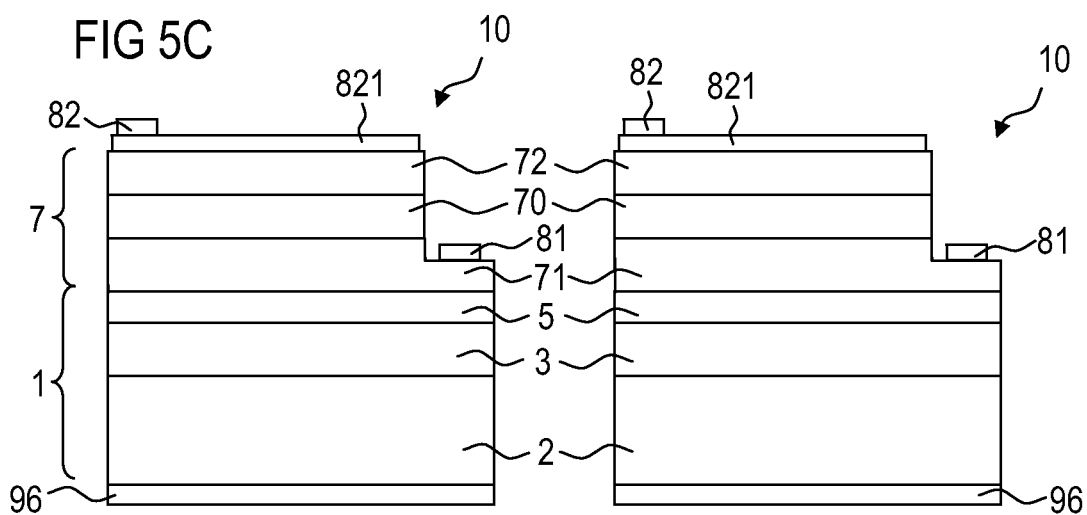

One exemplary embodiment of a method for producing a semiconductor chip is shown schematically in FIGS. 5A to 5C by way of intermediate steps.

As FIG. 5A shows, a composite substrate is provided, with a carrier 2 which contains radiation conversion material, a dielectric bonding layer 3 and a utility layer 5.

For simplified representation, a region of the composite substrate 1 is shown in the figures which, on production of the semiconductor chips, results in two semiconductor chips, the method being described by way of example for semiconductor chips which are constructed as described in relation to FIG. 4A.

A semiconductor layer sequence consisting of a first semiconductor layer 71, an active region and a second semiconductor layer 72 is deposited epitaxially on the utility layer 5 of the composite substrate 1, for instance using MBE or MOCVD (FIG. 5B). In contrast to an adhesion layer such as a glue layer or a solder layer, the dielectric bonding layer withstands the temperatures typical of epitaxy, for example, temperatures of between 700° C. and 1100° C., such that the carrier 2 is able to mechanically stabilize the semiconductor layer sequence during deposition.

To form the first contact 81, the first semiconductor layer 71 is exposed in places. This may be performed in particular chemically, for instance, wet chemically or dry chemically.

Deposition of the contacts 81, 82 and the radiation-transmissive contact layer and the minor layer 96 preferably proceeds by means of vapor deposition or sputtering.

This is followed by singulation into semiconductor chips, for example, by means of laser radiation, mechanically, for instance, by means of sawing, or chemically, for instance, by means of wet chemical or dry chemical etching.

In the above-described method, the semiconductor layers are deposited epitaxially on a composite substrate which already contains the radiation conversion material.

When singulating into semiconductor chip, therefore, semiconductor chips are obtained which already contain the radiation conversion material.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of semiconductor chips, the method comprising:
providing a composite substrate, the composite substrate having a carrier and a utility layer that is attached to the carrier by means of a dielectric bonding layer, the composite substrate being provided for epitaxial deposition of semiconductor layers, wherein the composite substrate contains a radiation conversion material;
depositing semiconductor layer sequence on the composite substrate, the semiconductor layer sequence having an active region configured to generate radiation;
reducing a thickness of the carrier after depositing the semiconductor layer sequence and adjusting the color locus of the radiation emitted by the semiconductor chips by electrically contacting the semiconductor chips during at least part of the reducing the thickness; and
singulating the composite substrate with the semiconductor layer sequence into a plurality of semiconductor chips.

2. The composite substrate according to claim 1, wherein the utility layer contains a nitride compound semiconductor material.

3. The composite substrate according to claim 1, wherein the utility layer has a thickness of at most 1 μm.

4. The composite substrate according to claim 1, wherein the dielectric bonding layer contains an oxide, a nitride or an oxynitride.

5. The composite substrate according claim 1, wherein a refractive index of the dielectric bonding layer decreases from the utility layer towards the carrier.

6. The composite substrate according to claim 1, in which on at least one side the bonding layer adjoins a boundary surface with patterning.

7. A semiconductor chip comprising:
a composite substrate according to claim 1; and
a semiconductor body with an active region intended for generating radiation arranged on the utility layer, wherein the radiation generated during operation is converted at least in part by the radiation conversion material.

8. The semiconductor chip according to claim 7, wherein the carrier comprises a mirror layer on the side remote from the semiconductor layer sequence.

9. The semiconductor chip according to claim 7, wherein a major face of the carrier remote from the semiconductor body forms a radiation exit face.

10. The semiconductor chip according to claim 7, wherein the carrier contains a ceramic and is formed for the most part by the radiation conversion material.

11. The semiconductor chip according to claim 7, wherein the carrier comprises a matrix material in which the radiation conversion material is embedded.

12. The method according to claim 1, wherein the adjusting the color locus comprises individually and separately adjusting the color locus of the radiation emitted by each of the semiconductor chips.

13. The method according to claim 1, wherein the reducing the thickness of the carrier is performed after the singulating the composite substrate.

14. The method according to claim 1, wherein the dielectric bonding layer comprises an oxynitride; and
    wherein a refractive index of the dielectric bonding layer decreases from the utility layer towards the carrier by a variation of nitrogen content.

\* \* \* \* \*

UNITED STATES PATENT AND TRADEMARK OFFICE
CERTIFICATE OF CORRECTION

PATENT NO. : 9,123,528 B2  
APPLICATION NO. : 13/883730  
DATED : September 1, 2015  
INVENTOR(S) : Johannes Baur et al.

Page 1 of 2

It is certified that error appears in the above-identified patent and that said Letters Patent is hereby corrected as shown below:

In the claims,

In Col. 10, line 33, claim 1, delete "depositing semiconductor layer sequence on the composite" and insert --depositing a semiconductor layer sequence on the composite--.

In Col. 10, line 44, claim 2, delete "The composite substrate according to claim 1," and insert --The method according to claim 1,--.

In Col. 10, line 47, claim 3, delete "The composite substrate according to claim 1," and insert --The method according to claim 1,--.

In Col. 10, line 49, claim 4, delete "The composite substrate according to claim 1," and insert --The method according to claim 1,--.

In Col. 10, line 52, claim 5, delete "The composite substrate according to claim 1," and insert --The method according to claim 1,--.

In Col. 10, lines 55 - 56, claim 6, delete "The composite substrate according to claim 1, in which on at least one side the bonding layer adjoins a boundary" and insert --The method according to claim 1, in which on at least one side the dielectric bonding layer adjoins a boundary--.

In Col. 10, lines 58 - 61, claim 7, delete "A semiconductor chip comprising: a composite substrate according to claim 1; and a semiconductor body with an active region intended for generating radiation arranged on the utility layer," and insert --The method according to claim 1, wherein the active region is arranged on the utility layer,--.

In Col. 10, line 65, claim 8, delete "The semiconductor chip according to claim 7," and insert --The method according to claim 1,--.

Signed and Sealed this  
Tenth Day of May, 2016

Michelle K. Lee  
*Director of the United States Patent and Trademark Office*

CERTIFICATE OF CORRECTION (continued)

U.S. Pat. No. 9,123,528 B2

In Col. 11, lines 1 - 2, claim 9, delete "The semiconductor chip according to claim 7, wherein a major face of the carrier remote from the semiconductor body" and insert --The method according to claim 7, wherein a major face of the carrier remote from the semiconductor layer sequence--.

In Col. 11, line 4, claim 10, delete "The semiconductor chip according to claim 7," and insert --The method according to claim 1,--.

In Col. 11, line 7, claim 11, delete "The semiconductor chip according to claim 7," and insert --The method according to claim 1,--.